United States Patent [19]

Mayberry

[11] 4,044,302
[45] Aug. 23, 1977

[54] TEST SET FOR MEASURING MAGNETIC PROPERTIES OF MAGNETIC AMPLIFIER CORES BY SINUSOIDAL CURRENT EXCITATION

[76] Inventor: Leonard Adolphus Mayberry, 710 Paul St., Escondido, Calif. 92027

[21] Appl. No.: 694,308

[22] Filed: June 9, 1976

[51] Int. Cl.$^2$ .................................................. G01R 33/12
[52] U.S. Cl. ........................ 324/34 MC; 340/174 TC
[58] Field of Search ..................... 324/34 R, 34 MC; 340/174 TC

[56] References Cited

U.S. PATENT DOCUMENTS

| | | | |
|---|---|---|---|
| 3,229,195 | 1/1966 | Kadish | 324/34 MC |
| 3,238,449 | 3/1966 | Gordon et al. | 324/34 MC |
| 3,492,662 | 1/1970 | Whitson et al. | 324/34 MC |
| 3,543,155 | 11/1970 | Maddox et al. | 324/34 MC |
| 3,609,528 | 9/1971 | Smith | 324/34 MC |

OTHER PUBLICATIONS

Goss, H.; Current Pulse Generator Tests Magnetic Cores Electronics; Jan. 1960; pp. 80-81.

Primary Examiner—Robert J. Corcoran
Attorney, Agent, or Firm—Brown & Martin

[57] ABSTRACT

A test set for measuring magnetic properties of magnetic amplifier cores wherein a repetitive constant current sinusoidal drive signal for producing a magnetic field in the core is repeated at a low duty cycle rate of not more than one full sine wave in one hundred sine waves. The test set includes a test fixture wherein portions of the primary and secondary windings are connected in a cover and table and terminate in mating contacts rigidly extending therefrom, such that when the cover is moved from the table, the windings are separated at their mating contacts so that a test core can be inserted within the windings.

13 Claims, 7 Drawing Figures

TEST SET FOR MEASURING MAGNETIC PROPERTIES OF MAGNETIC AMPLIFIER CORES BY SINUSOIDAL CURRENT EXCITATION

BACKGROUND OF THE INVENTION

The present invention is directed to improved apparatus for measuring the magnetic properties of magnetic amplifier cores.

Progress in the development of better magnetic materials led to the design of magnetic amplifier systems and other types of switching reactors and transformers. Since the origin of the magnetic amplifier (circa 1950), and the concurrent growth of semiconductor technology, magnetic circuits of various types have been employed in a very large assortment of electronic systems. The principal contribution of these circuits has been smaller size, lower cost, and a great improvement in efficiency, due in a large part to improved magnetic core materials.

The current wide usage of these core materials has warranted a close look at the test equipment being used for evaluation of the cores.

Basically a prior art test set for measuring magnetic properties of magnetic amplifier cores includes a device for receiving a magnetic amplifier core for test. This device includes a primary winding for providing a drive signal to produce a magnetic field in the test core and a secondary winding for sensing an output signal indicative of the magnetic flux produced in the core in response to the drive signal. However, no provision is made for direct reading of magnetic properties on calibrated scales, which means that each measurement taken must be followed by mathematical calculations to arrive at the correct interpretation.

A typical prior art test set also necessarily includes an electrical circuit for producing a repetitive constant current drive signal having a variable voltage, such as a sinusoidal waveform signal. The electrical circuit for producing the drive signal which is provided by the primary winding typically includes magnetic components such as transformers for providing the peak power levels at which the magnetic cores must be tested. Because it takes several hours on the part of a skilled engineer to test one core, the magnetic amplifier core is almost the only component part placed in stock with no inspection tests. To inspect every core, even in a small lot of 50 cores or less, would be untenable, and therefore is not done. In effect, the prior art test sets have been found to be commercially impractical for use in testing magnetic amplifier cores. Accordingly, most users of the cores rely solely on the performance characteristics as published in core supplier catalogs. In many cases, the user of the core designs it into a circuit expected to perform in a manner not covered by the published characteristics. As a result of the very cumbersome and inadequate test methods used by the core supplier, and the lack of practical equipment to measure the cores during the design phase of the end item equipment, the design of magnetic circuits is more an "art" than a science.

In addition (and perhaps more serious) due to lack of practical test equipment, magnetic amplifier cores that are received in large quantities often are placed in stock for use in production without benefit of any kind of receiving inspection tests. This situation leads to increased manufacturing costs due to scrap and rework, and in many cases marginal or defective equipment is allowed to reach the field.

SUMMARY OF THE INVENTION

The present invention is a test set for measuring magnetic properties of magnetic amplifier cores, that can be operated easily and quickly.

The test set of the present invention is characterized by a circuit that causes the drive signal provided to the primary winding to be repeated at a low duty cycle rate rather than continuously. Preferably the duty cycle rate should not be more than approximately one in one hundred. This means that over the time in which one hundred cycles of the constant current variable voltage signal could be produced, only one cycle is provided to the primary winding.

This feature enables a high peak power test signal to be applied to the core under test, while enabling the average power consumed by the test set to remain much lower. As a result, many cores can be tested rapidly without overheating the test set, and such magnetic components as transformers can be eliminated from the device in favor of solid state components.

The test set of the present invention also preferably includes means for varying the frequency of the drive signal so that the test set can be used over the wide range of frequencies at which magnetic cores are being operated in modern applications.

Another feature of the invention is that the devices for measuring the drive signal and the output signal preferably are calibrated to provide direct readings of the pertinent magnetic properties in magnetic units. Measurements of the drive signal may be read in units of magnetomotive force, such as Gilberts; and measurements of the output signal may be read in units of magnetic flux, such as Maxwells.

The test set of the present invention is further characterized in its preferred embodiment by a test fixture which enables test cores to be rapidly inserted in, and removed from, the test set. This fixture includes a table, a cover and guide rods. The table receives the test core, and includes portions of the primary and secondary windings, with portions of both of these windings rigidly extending upward from the table. The cover includes portions of the primary and secondary windings with portions of both of these windings rigidly extending downward from the cover in positions to mate with corresponding portions of the respective windings extending upward from the table. The guide rods couple the cover with the table. The cover is movable on the rods for enabling the corresponding extending portions of the primary and secondary windings to be mated together to complete the primary and secondary windings when the cover is moved toward the table, and for enabling the corresponding extending portions of the primary and secondary windings to be separated so that the test core can be placed within the windings when the cover is moved away from the table.

This feature of the test set is most important in that it enables tests to be made at a rate of as high as one core approximately every 4 seconds, thereby permitting up to 900 cores per hour to be measured. This short time cycle, in contrast to the several hours per core now required, will enable incoming inspection of production lots to be performed in a practical and economical manner.

DESCRIPTION OF THE PREFERRED EMBODIMENT

Figure 1:
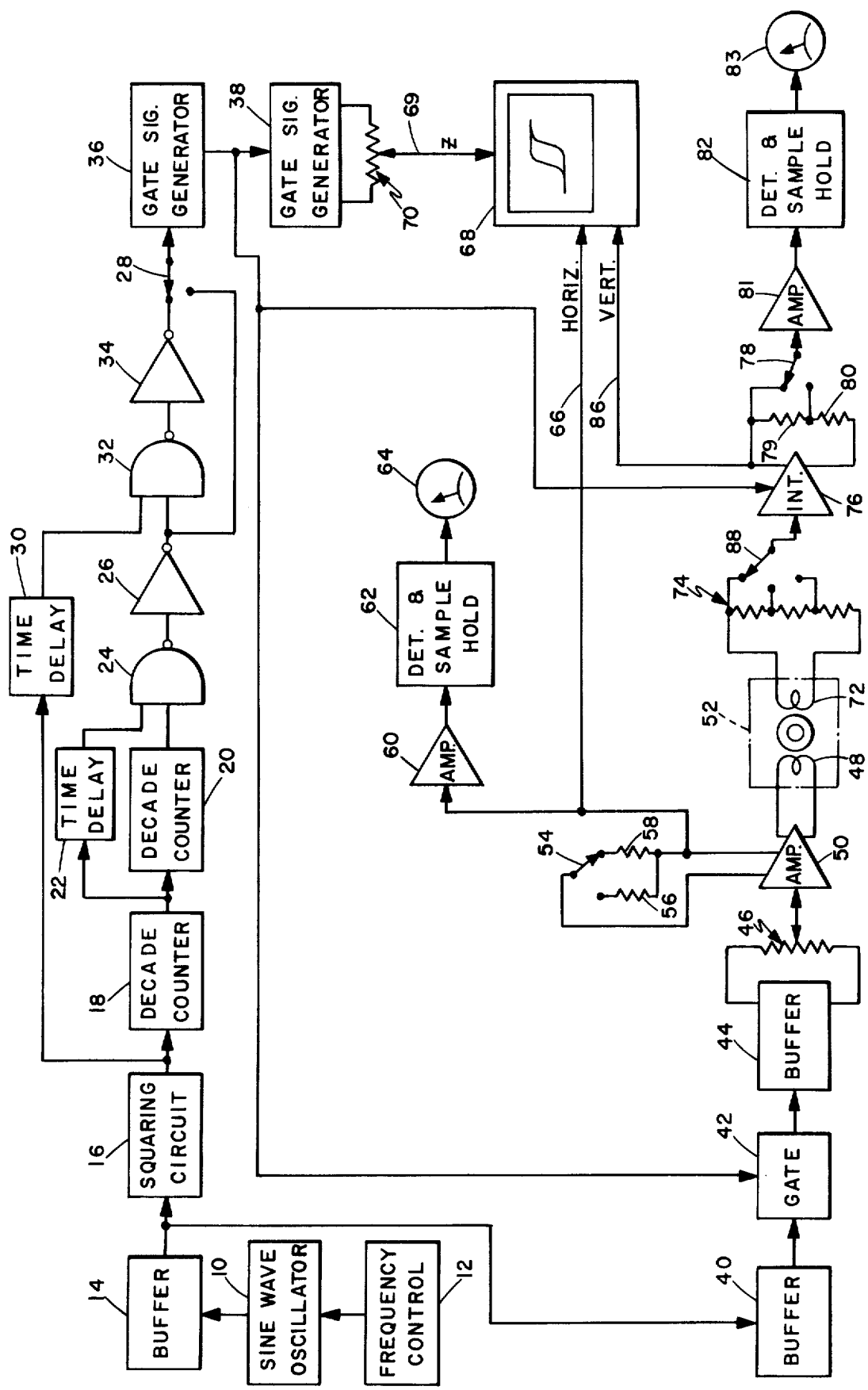
FIG. 1 is a schematic circuit diagram of the test set of the present invention.

Referring to FIG. 1, the basic signal for driving the core under test is first generated at a low power level by an adjustable frequency sine wave oscillator 10 having an adjustable frequency control 12. A continuous sine wave signal is generated and passed through a buffer amplifier 14 and transformed into a square wave signal of the same frequency by means of the squaring circuit 16. The resultant square wave signal is used to activate two cascaded decimal counters 18 and 20. The output of the counter 18 is passed through a time delay circuit 22 and combined with the output of the counter 20 in a NAND gate 24. The output of the NAND gate 24 is one square pulse (equal in width to one cycle of the original sine wave) out of every 100 sine wave cycles. The output of the NAND gate 24 is inverted by an inverter 26 to the correct polarity for later use. The output pulse of the inverter 26 is connected to one position (the open position shown in FIG. 1) of a two-position switch 28. The output of the squaring circuit 16 is also passed through a time delay circuit 30 and combined with the output of the inverter 26 in a NAND gate 32 to produce one square pulse (the width of which is equal to the time interval of one-half cycle of the original sine wave) out of every 100 sine wave cycles.

The output of the NAND gate 32 is inverted by an inverter 34 to the correct polarity for later use. The output pulse of the inverter 34 is connected to the other position of switch 28. The signal at the rotor of switch 28 is a pulse equal in width to either one cycle out of each 100 cycles, or one-half cycle out of each 100 cycles, depending on the setting of the switch 28. The rotor signal is used to drive two gate signal generators 36 and 38.

The output of the continuous sine wave oscillator 10, appearing at the output of the buffer amplifier 14, is fed through a buffer amplifier 40 to the input of a sine signal transmission gate 42. The gate signal generator 36 provides a bi-polarity pulse which is used to gate the sine signal transmission gate 42. The output of the sine signal transmission gate 42 consists of either exactly one cycle or one-half cycle out of every 100 cycles, depending on the position of switch 28. The signal output from the sine signal transmission gate 42 is fed through buffer amplifier 44 to a potentiometer 46 which serves to control the peak voltage of the drive signal provided to the primary winding 48. The output terminal, or arm, of the potentiometer 46 is connected to a power amplifier 50 which is arranged to produce a constant current drive signal to the two-turn "primary" winding 48 of a test fixture 52. The power amplifier 50 has a maximum linear output of 10 amperes peak at any frequency from 400 Hz to 30 Kilohertz, the frequency range of the preferred embodiment of the test set being described.

The significance of providing for low duty cycle drive signal is pointed out when the power levels are considered. In the test set being described, 10, amperes peak at 36 volts = 360 watts peak power or 180 watts average power per one-half cycle. If this drive were continuous the output stage of the constant current power amplifier 50 would have to dissipate practically all of the 180 watts. This would mean that each output transistor would be required to dissipate approximately 90 watts. On the other hand, at one cycle out of every 100, the average power dissipation of 0.9 watts per output transistor makes feasible a practical and economical apparatus and yet one which will supply sufficient drive for testing the wide range of magnetic cores currently in use.

Another advantage of a low duty cycle is that the total power taken from the power mains by the entire test set is less than five watts for a core drive signal of 360 watts peak. This feature has made it possible to use solid state components instead of transformers, thereby providing a compact portable "instrument" type test set which can be carried from place to place.

Still referring to FIG. 1, the full scale value of the peak of the constant current output of the power amplifier 50 is fixed by positioning a switch 54 to include either a resistor 56 or a resistor 58 in the circuit of the power amplifier circuit 50. The voltage gain of the entire system from the sine wave generator 10 to resistor 56 or resistor 58 is fixed and held constant such that 5 volts peak across resistor 56 (which is 0.5 ohms) corresponds to a 10 amperes peak drive signal and 5 volts peak across resistor 58 (which is 5 ohms) corresponds to a one ampere peak drive signal.

The voltage across resistor 56 or resistor 58 is monitored by a metering circuit. The metering circuit includes an amplifier 60, a peak detector and sample-hold circuit 62 and a readout device 64. The time constant of the sample-hold circuit 62 is adjusted to give a flutter-free reading with the readout device 64 at the lowest test frequency of 400 Hz, which when divided by the one cycle out of each 100 cycles ratio equals four peaks per second.

Figure 2:
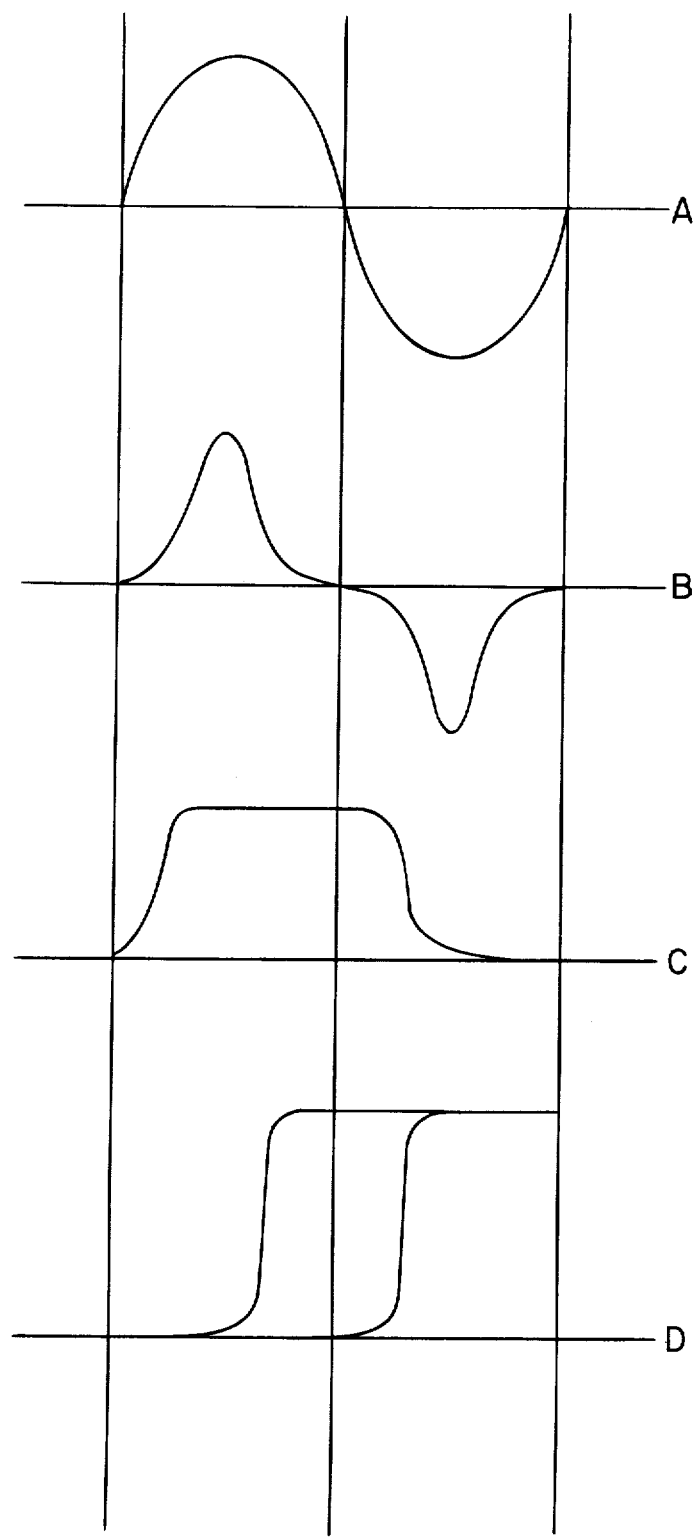
FIGS. 2A through 2D illustrates waveforms of signals present in the circuit of FIG. 1.

The metering circuit is linearized by feedback techniques such that the readout device 64 can be either a moving coil meter with a linear scale or a digital meter. The calibration of the entire test set is such that the meter 64 reads directly in Gilberts; with a zero to 25 Gilberts range when the switch 54 is positioned to include resistor 56 in the circuit; and zero to 2.5 Gilberts when resistor 58 is included in the circuit. The potentiometer 46 along with the metering circuit permits accurately setting the drive signal to any value between 0.05 and 25 Gilberts. The waveform of the drive signal is illustrated in FIG. 2A.

The drive signal is provided via line 66 to the horizontal amplifier of an accessory oscilloscope 68. The second gate signal generator 38 supplies a Z axis blanking pulse via line 69 to the oscilloscope 68, and is adjustable by means of a potentiometer 70.

A two-turn secondary winding 72 of the test fixture 52 is connected through a calibrated attenuator 74 to an integrator 76. The waveform of the output signal from the secondary winding 72 is illustrated in FIG. 2B; and the waveform of the signal from the integrator 76 is illustrated in FIG. 2C. The integrator 76 is gated "on" by one polarity of the gate pulse from the gate signal generator 36 and is reset by the second polarity of the gate pulse. The integrator 76 is "on" during the interval corresponding to one cycle (or one-half cycle) of the selected test frequency and "off" during the other 99 cycles. The integrator 76 is bias stabilized and reset during the "off" period. The integrator output is linear over the operating frequency range of 400 Hz to 30 Kilohertz and is drift stabilized. The output signal from the integrator 76 is used to drive a metering circuit, which includes a switch 78, resistors 79 and 80, an amplifier 81, a peak detector and sample-hold circuit 82 and a readout device 83. This metering circuit corresponds to the metering circuit for the drive signal 60, 62, 64 described hereinabove. The output signal from the integrator 76 is provided via line 86 to the vertical amplifier of the oscilloscope 68, thereby permitting direct observation of the hysteresis loop (as illustrated in FIG. 2D) if desired.

The metering circuit 78, 79, 80, 81, 82, 83 is calibrated to read directly in Maxwells. The full scale value in Maxwells is determined by the settings of switch 88 for the attenuator 74 and the switch 78. The scales provided are: 500; 1000; 5000; 10,000; 50,000; 100,000; Maxwells. The linearity of this metering circuit is such that a minimum value of 10 Maxwells can be read.

Figure 3:
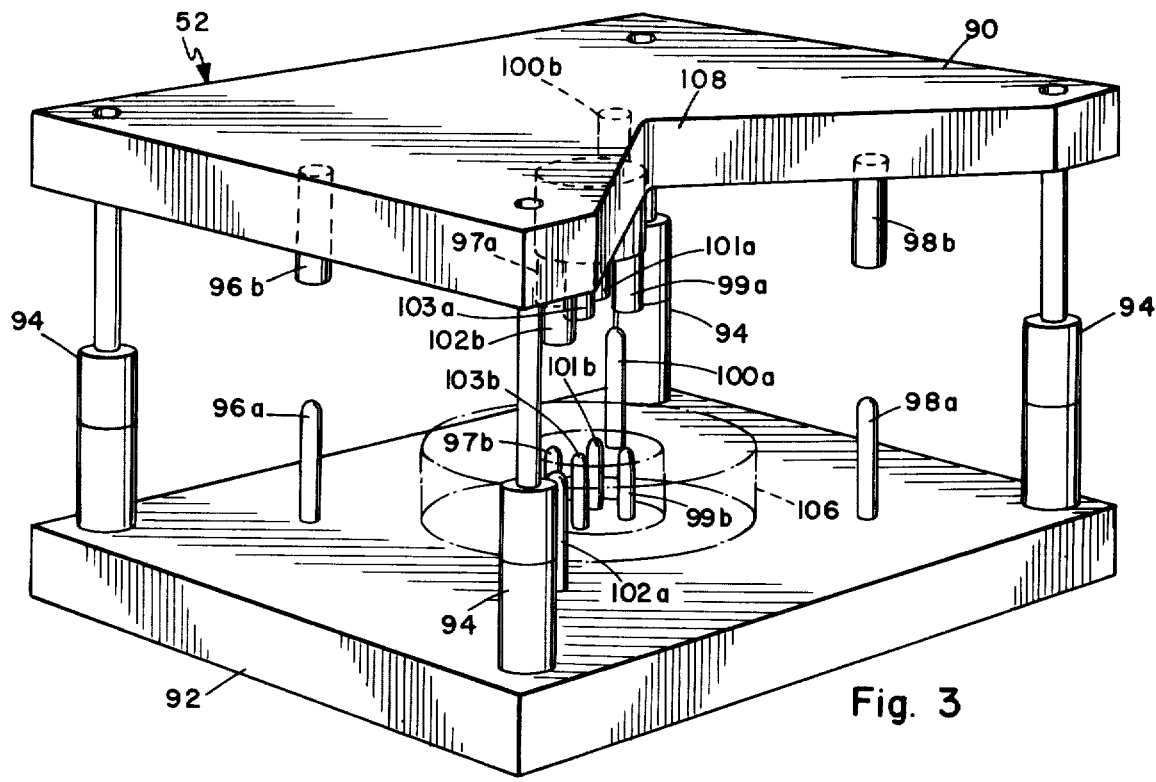
FIG. 3 is a perspective view of the test fixture included in the test set of the present invention.
Figure 4:
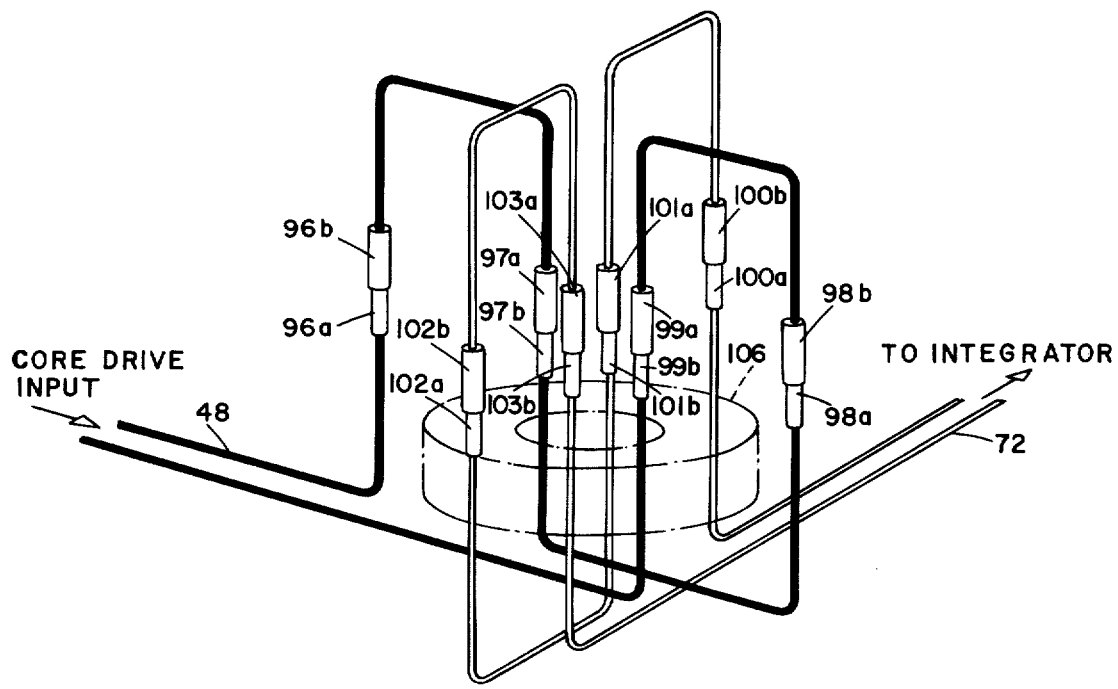
FIG. 4 is a perspective view showing the alignment of the primary and secondary windings in the test fixture of FIG. 3.

The test fixture 52 is shown in FIG. 3. The positioning of the primary winding 48 and the secondary winding 72 within the test fixture 52 is shown in FIG. 4.

The test fixture 52 includes a cover 90, a table 92, guide rods 94 and a number of mating contacts for mating together the various positions of the windings 48, 72, that are rigidly positioned in the cover 90 and table 92. The primary winding 48 extends through mating contacts 96a; 96b; 97a; 97b; 98a; 98b; and 99a; 99b. The secondary winding 72 extends through mating contacts 100a; 100b; 101a; 101b; 102a; 102b; and 103a; 103b. The windings 48, 72 are placed in fixed positions having a 90° relationship to one another to effectively cancel out undesired residual coupling due to mutual inductance; and each winding has the equivalent of not more than two turns.

Portions of the primary winding 48 rigidly extend upward from the table 92 and terminate in mating contacts 96a, 97b, 98a and 99b. The matching portions of the primary winding 48 rigidly extending downward from the cover 90 and terminate in corresponding mating contacts 96b, 97a, 98b and 99a respectively.

Portions of the secondary winding 72 rigidly extend upward from table 92 and terminate in mating contacts 100a, 101b, 102a and 103b. The matching portions of the secondary winding 72 rigidly extend downward from the cover 90 and terminate in corresponding mating contacts 100b, 101a, 102b and 103a respectively. The corresponding portions of the primary and secondary windings 48, 72 are positioned in the test fixture 52, to mate with each other.

The guide rods 94 couple the cover 90 to the table 92. The cover 90 is movable on the rods 94 for enabling the corresponding extending portions of the primary and secondary windings 48, 72 to be mated together to complete such windings when the cover 90 is moved toward the table 92. When the cover is moved on the rods 94 away from the table 92, the corresponding extending portions of the windings 48, 72 are separated so that a test core 106 can be placed within the windings for testing. The cover 90 includes a notch 108 for making it easier to insert a test core 106 in the test fixture 52.

The test set of the present invention can be used in the following manner in performing an engineering evaluation of an unknown test core expected to be used in some kind of specific magnetic amplifier type circuit.

The test core 106 is placed in the test fixture 52. A test frequency is selected with the frequency control 12. Suitable Gilbert and Maxwell scales are selected by positioning the switches 54 and 78. The potentiometer 46 is adjusted to provide a drive signal that results in an output signal from the integrator 76 that corresponds to core saturation. ($\phi$ max.) Switch 28 is changed from the one cycle to the one-half cycle position and the incremental induction is read on the Maxwell meter ($\Delta \phi /2$). A "gain" transfer curve of the core can be plotted if desired by observing Maxwells vs. Gilberts over any range desired from 0.05 Gilberts to the value required for saturation. The frequency characteristics and core loss factors can be readily determined by repeating the above procedure at several selected frequencies within the range of the particular test set.

The test set of the present invention can be used in the following manner to inspect incoming lots of production cores.

The inspector sets the controls on the test set in accordance with a specification established by the design engineer. Then the test cores are placed in the test set one at a time and core response readings in Maxwells are observed to either fall within the specified tolerance limits or not.

A complete hystersis loop is provided as follows: During the one cycle sine wave constant current drive signal applied to the core under test, the flux is driven through positive saturation to remanence during the positive half cycle of the drive signal, and then driven from positive remanence through negative saturation to negative remanence during the negative half cycle of the drive signal. This cycle is repeated at regularly spaced intervals corresponding to the duty cycle being used, (1 cycle per 100 cycles in the preferred embodiment), thereby permitting steady state meter readings of the pertinent core characteristics to be observed, and in addition, permitting oscilloscope display of the entire hysteresis loop.

By means of the test set of the present invention, core gain, core loss, permeability, coercive force, flux density, and core linearity can be readily measured over a wide range of frequencies.

Other apparatus, providing higher drive power, a different frequency range, and larger or smaller test fixtures for accommodating different cores, are possible without departing from the basis principles of this invention.

Having described my invention, I now claim:

1. A test set for measuring magnetic properties of magnetic amplifier cores, comprising,
   means for receiving a magnetic amplifier core for test, including a primary winding for applying a sinusoidal drive signal to produce a magnetic field in said core, and a secondary winding for sensing an output signal indicative of the magnetic flux produced in said core in response to said drive signal, and
   means for producing a repetitive constant current sinusoidal drive signal coupled to said primary winding for providing said applied sinusoidal drive signal,
   wherein the improvement comprises,
   means for causing said sinusoidal drive signal to be repeated at a low duty cycle rate of not more than one full sine wave in one hundred sine waves.

2. A test set according to claim 1 comprising means for varying the frequency of said drive signal over a range between 400 Hz and 30 Kilohertz.

3. A test set according to claim 2, wherein the primary winding has not more than the equivalent of two turns and the secondary winding has not more than the equivalent of two turns.

4. A test set according to claim 1 comprising means for varying the frequency of said drive signal.

5. A test set according to claim 4, wherein said duty cycle is not more than one-half sine wave in one hundred sine waves.

6. A test set according to claim 1, comprising means for providing a reading of the drive signal in units of magnetomotive force.

7. A test set according to claim 6, comprising means for providing a reading of said output signal in units of magnetic flux.

8. A test set according to claim 7, further comprising,
display means coupled to said means for producing said drive signal and to said secondary winding for providing display of a hysteresis loop for said core in response to said drive signal and said output signal.

9. A test unit according to claim 1, comprising means for providing a reading of said output signal in units of magnetic flux.

10. A test set according to claim 1 wherein the core receiving means comprises,
a table for receiving said test core, and including portions of the primary and secondary windings, with portions of both of the windings rigidly extending upward from the table,
a cover including portions of the primary and secondary windings with portions of both of the windings rigidly extending downward from the cover in positions to mate with corresponding portions of the respective windings extending upward from the table, and
guide rods coupling the cover with the table, the cover being movable on the rods for enabling the corresponding extending portions of the primary and secondary windings to be mated together to complete the primary and secondary windings when the cover is moved toward the table, and for enabling the corresponding extending portions of the primary and secondary windings to be separated so that said test core can be placed within the windings when the cover is moved away from the table.

11. A test set according to claim 10, wherein the primary winding has not more than the equivalent of two turns and the secondary winding has not more than the equivalent of two turns.

12. A test set according to claim 11, comprising means for varying the frequency of said drive signal over a range between 400 and 30 kilohertz.

13. A test set according to claim 1, wherein the primary winding has not more than the equivalent of two turns and the secondary winding has not more than the equivalent of two turns.

* * * * *